United States Patent [19]

Chao

[11] Patent Number: 4,466,177

[45] Date of Patent: Aug. 21, 1984

[54] STORAGE CAPACITOR OPTIMIZATION FOR ONE DEVICE FET DYNAMIC RAM CELL

[75] Inventor: Hu H. Chao, Pleasantville, N.Y.

[73] Assignee: International Business Machines Corporation, Armonk, N.Y.

[21] Appl. No.: 509,735

[22] Filed: Jun. 30, 1983

[51] Int. Cl.³ .............................................. H01L 21/94
[52] U.S. Cl. .................... 29/571; 29/577 C; 29/578; 357/51
[58] Field of Search ................... 29/571, 577 C, 578; 148/1.5; 357/51

[56] References Cited

U.S. PATENT DOCUMENTS

| | | | |
|---|---|---|---|
| 4,240,092 | 12/1980 | Kuo | 357/41 |
| 4,322,881 | 4/1982 | Enomoto et al. | 29/571 |
| 4,391,032 | 7/1983 | Schulte | 29/571 |
| 4,397,077 | 8/1983 | Derbenwick et al. | 29/571 |

*Primary Examiner*—Aaron Weisstuch
*Attorney, Agent, or Firm*—Jackson E. Stanland

[57] ABSTRACT

A process for providing different insulator systems for the storage capacitor and the FET in a single polysilicon one-device memory cell, such as a dynamic RAM cell, without requiring an additional masking level. In particular, the Hi-C or diffusion store ion implantation mask is used to implement this feature. This process can be used to provide different materials in the insulator system of the storage capacitor and the FET, or the same materials with different thicknesses.

22 Claims, 15 Drawing Figures

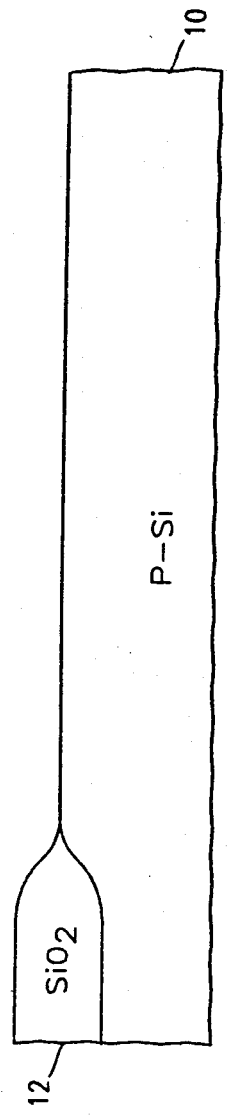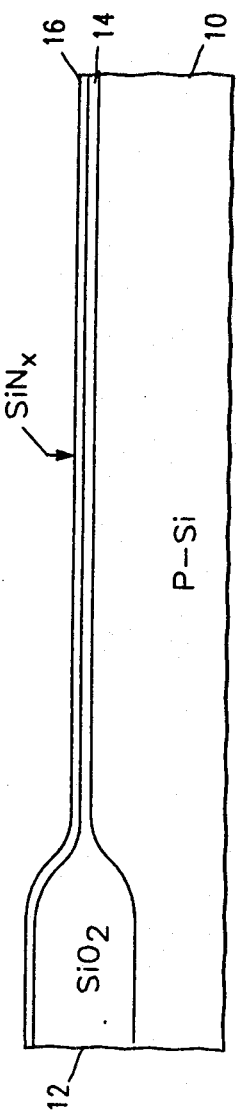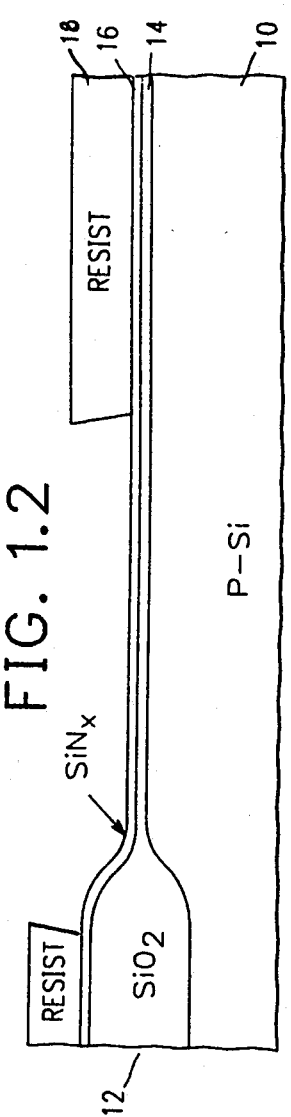

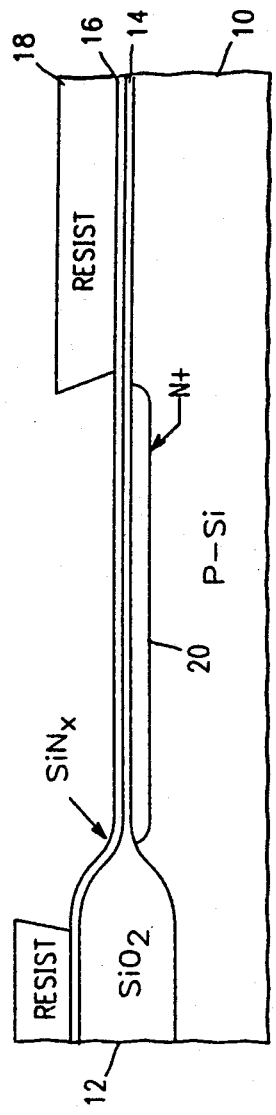
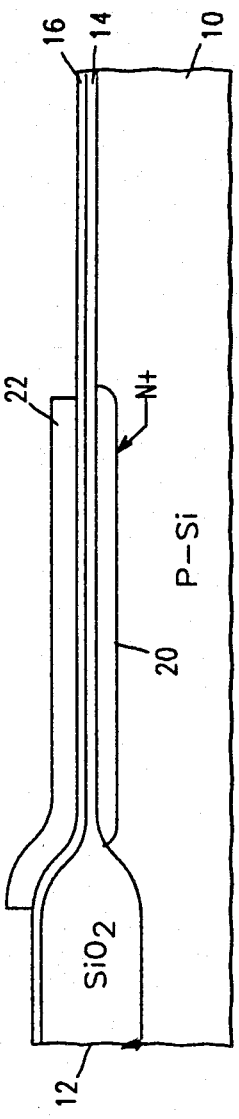
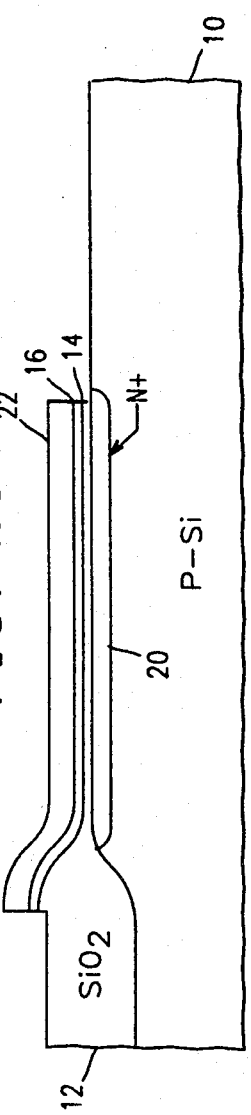

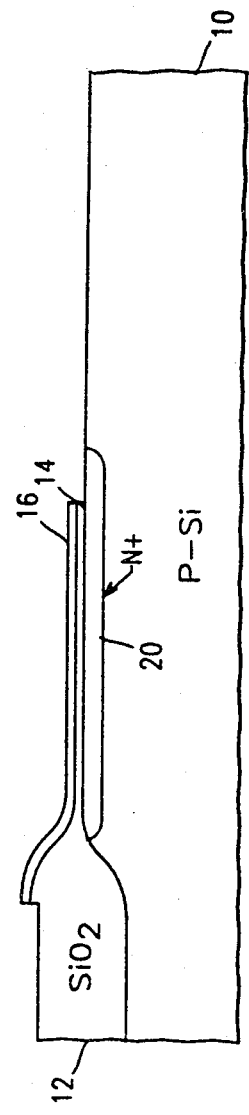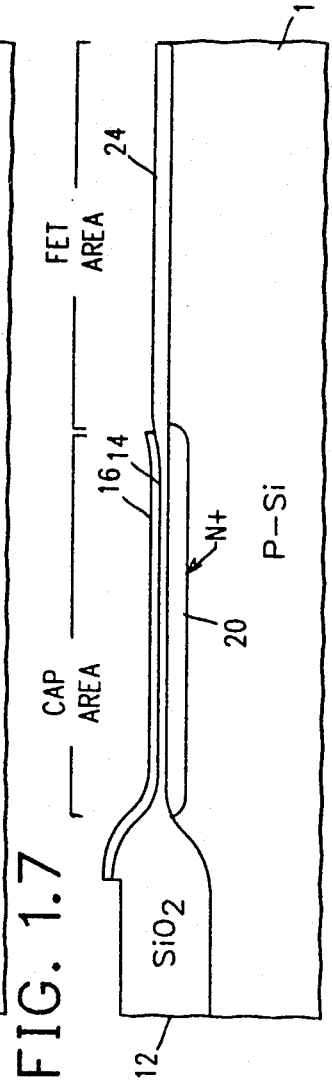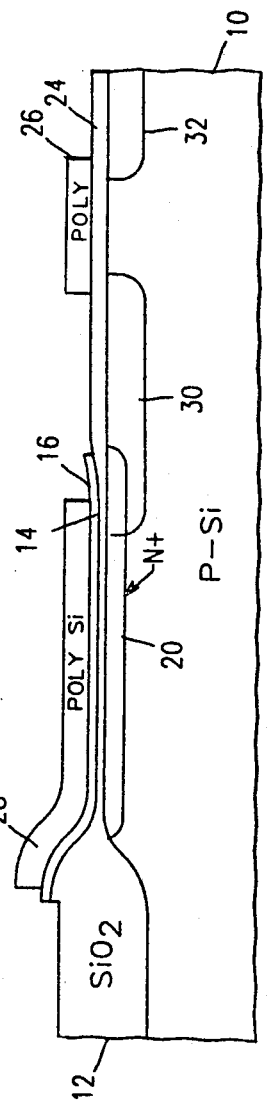
FIG. 1.7  FIG. 1.8  FIG. 1.9

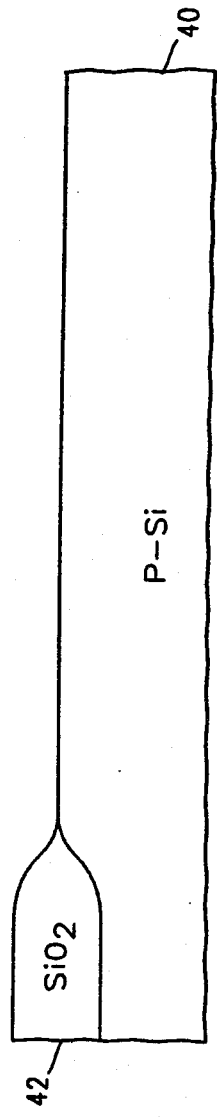
FIG. 2.1
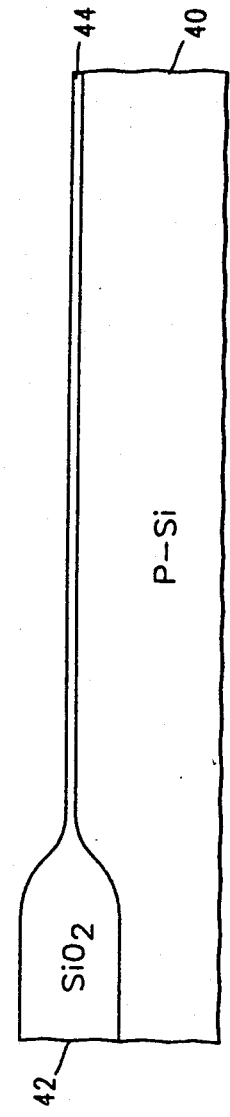
FIG. 2.2
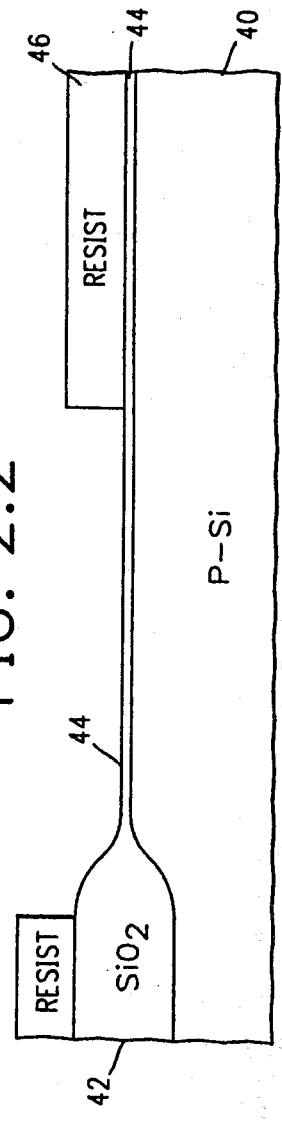
FIG. 2.3

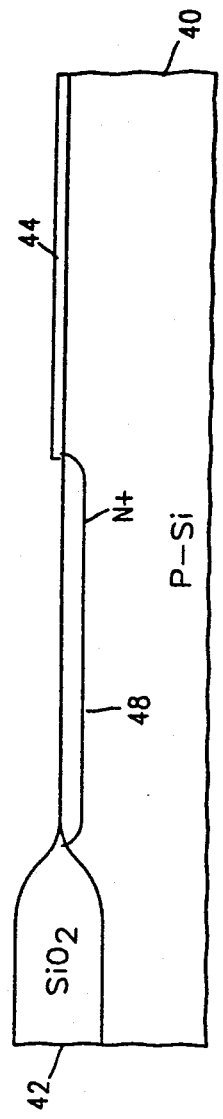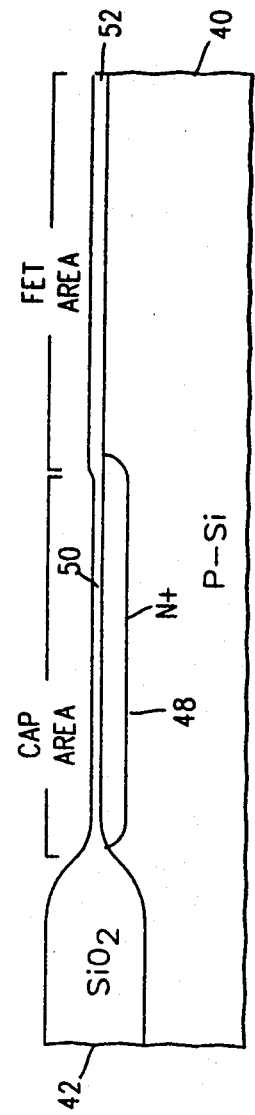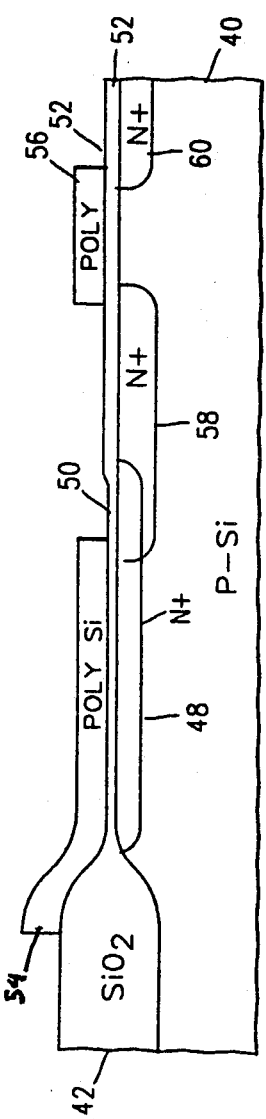

STORAGE CAPACITOR OPTIMIZATION FOR ONE DEVICE FET DYNAMIC RAM CELL

DESCRIPTION

1. Technical Field

This invention relates to a process for making one device FET-capacitor circuits of the type used in memory applications and including a single polycrystalline semiconductor layer, and more particularly to an improved process for making such a device wherein the dielectric insulation layer for the storage capacitor can be optimized and can comprise different materials than those used in the dielectric layer of the FET gate.

2. Background Art

Integrated circuit structures comprising field effect transistors (FET's) have been used for many purposes. In particular, FET integrated circuit memory arrays and processes for fabricating them are well known. Reference is made to U.S. Pat. No. 3,387,286 which discloses such circuits and in particular a circuit using a single FET and a capacitor for the storage of information. Such a simplified integrated circuit is well known in the industry and widely used.

Memory cells of the type described in the previous paragraph have been known in the art as "Dennard cells", named for the inventor who first proposed such cells. These cells are characterized by the use of a single FET with an associated capacitor which is used to store information in the memory cell. These circuits are generally fabricated in a semiconductor substrate, such as a silicon substrate. One electrode of the capacitor is a doped region of the silicon substrate, while the second electrode of the storage capacitor can be provided by an overlying layer of polycrystalline semiconductor, such as polysilicon. Often, the gate electrode of the FET is also comprised of polysilicon, although metals can be used for this purpose and for the capacitor electrodes. Memory cells which use a single layer of polysilicon are often termed "single poly" structures, while memory cells using two layers of polysilicon are generally termed "double poly" cells. This type of memory cell is also termed a "one device" memory cell because it requires only a single FET.

In these one-device memory cells, it is known that the requirements for the dielectric layer in the capacitor are different than those for the dielectric layer of the FET insulated gate. Generally, it is desirable to have a somewhat thinner dielectric layer in the storage capacitor than in the region of the gate electrode of the FET. Still further, it is known in the art to provide different dielectric materials in the storage capacitor and in the gate insulation of the FET. Generally, the requirements of the insulator system for the storage capacitor are less stringent than those for the gate insulator of the FET, and the sensitivity of the FET characteristic to the flat band voltage $V_{FB}$ shift. When the doped region of the substrate is used for one electrode of the capacitor, small changes in $V_{FB}$ do not greatly affect the device operation.

In one-device memory cells of the type described, different insulator systems (including different thicknesses and/or materials) are easily accomplished if additional masking levels are used. The use of additional masking levels allows one to form the capacitor insulation at a first time and the gate insulation of the FET at another time. Different materials can be used for these two insulation layers, and their thicknesses can be individually tailored to provide optimum device functions, when multiple masking steps are allowed.

For double poly, one-device memory cells, it is also quite simple to provide different insulator systems for the storage capacitor and for the FET. This is because multiple layers of polysilicon are used, requiring the formation of an additional insulating layer. Generally, each of the multiple polysilicon layers is used for a different purpose, and the additional masking steps mean that the insulator systems can be tailored to the requirements of the storage capacitor and the FET.

References describing these types of memory cells include U.S. Pat. Nos. 3,811,076 and 3,841,296. For example, reference is made to column 6 of U.S. Pat. No. 3,811,076 where different materials are used in the storage capacitor and the FET in a circuit using a polysilicon capacitor electrode and a metal gate electrode.

Another reference of interest is a paper by Ohta et al. which was presented at the 1980 IEEE International Solid State Circuits Conference, and which is contained in a digest of technical papers published for that conference, at pages 66 and 67. This reference describes various high dielectric constant materials for the storage capacitor, and in particular describes the use of tantalum oxide. A structure including a poly gate and recessed oxide regions (ROX) for isolation is described. One device memory cells using only a single polysilicon layer to provide an electrode for the storage capacitor and the gate electrode are important and useful circuits. However, no good procedure has been developed or suggested in the art for allowing one to optimize both the dielectric of the storage capacitor and the dielectric forming the gate insulation. With only a single polysilicon layer and without the luxury of additional masking steps, a difficult problem is presented. Accordingly, it is a primary object of the present invention to provide a process for making a one device memory cell of the type herein described where the gate insulation and storage capacitor insulation can be individually tailored for their respective purposes.

It is another object of this invention to provide a process of the type described in the preceding object, where these different insulators can be formed without the need for additional masking levels.

It is another object of the present invention to provide a process for making a one device FET-storage capacitor circuit where the diffusion store ion implantation mask level or the Hi-C mask level can be used to provide different insulator systems for the storage capacitor and the FET.

It is a further object of the present invention to provide a method for forming a one-device FET-storage capacitor integrated circuit in which the gate insulation layer and the storage capacitor insulation layer are comprised of the same material, but have different thicknesses.

It is another object of this invention to provide a process for forming a one-device integrated memory cell comprising a single FET and a storage capacitor, where the materials for the capacitor dielectric and the gate insulation dielectric are different.

It is a further object of the present invention to provide an improved process for making a one-device integrated memory circuit comprising a single FET and a storage capacitor, wherein different insulator systems can be provided for both the storage capacitor and the FET using an existing mask level that is used to provide another layer in the integrated circuit structure.

Disclosure of the Invention

The invention is an improved process for making a single polysilicon, one-device memory cell including a single FET and a storage capacitor, wherein different insulator systems can be provided for the storage capacitor and the FET, without requiring any additional masking levels. The insulators for the storage capacitor and the FET can be comprised of the same or different materials, and can have different thicknesses. In this process, the mask level used to provide the doped region function as one electrode of the capacitor or the Hi-C region is used to provide different insulator systems. This is achieved by using that masking level to change the nature of the layers present in the storage capacitor area relative to the layers in the FET gate area.

In one embodiment, a protective metal layer is deposited through an opening in a resist masking layer to protect underlying insulation in the storage capacitor region. During a later etching step, insulation in the FET area will be etched, while the metal layer protects insulation in the storage capacitor area. In this embodiment, the gate insulation material is different than the capacitor insulation material.

In another embodiment, underlying insulation is removed from the storage capacitor area using the Hi-C or diffusion store ion implantation mask level. In the FET area, insulation is left. When an insulating layer is later grown, it will have a greater thickness in those areas where the underlying insulation was not removed. This will provide different insulator thicknesses in the storage capacitor and the FET.

These and other objects, features, and advantages will be apparent from the following more particular description of the preferred embodiments.

Brief Description of the Drawings

FIGS. 1.1–1.9 show a preferred embodiment for providing different insulator systems for the storage capacitor and the FET in single poly one-device integrated memory cells.

FIGS. 2.1–2.6 show another embodiment for providing different insulator systems for the storage capacitor and the FET in single poly one-device FET integrated memory cells.

Best Mode for Carrying out the Invention

In the practice of this invention, a method is shown using an existing mask level (the Hi-C ir diffusion store ion implantation mask level) to provide different insulator systems for the storage capacitor and the FET in this integrated circuit. The invention is directed to the case where a single polysilicon layer is used for both the capacitor electrode and the gate electrode in the FET.

FIGS. 1.1–1.9

These drawings illustrate a preferred mode for the practice of the present invention, and one which can be used to provide different materials in the gate insulation and the storage capacitance insulation. FIG. 1.1 illustrates the standard poly gate FET process up to the pad oxide etch step. In this process, a P-type semiconductor substrate 10 can be comprised of a material such as silicon. Substrate 10 is indicated by the legend P-Si. The recessed field oxide region 12 is comprised of $SiO_2$, which is thermally grown and is used to provide isolation between adjacent memory cells.

The process to provide the structure of FIG. 1.1 is well known in the art. In this process, a thin oxide is thermally grown on the substrate 10, followed by chemical vapor deposition (CVD) of a silicon nitride layer. The silicon nitride layer is then patterned and a thicker oxide is grown on those areas of the silicon oxide where the silicon nitride layer has been removed. The remaining thin oxide and silicon nitride is then etched away, leaving the field isolation regions 12.

A thin thermal oxide layer 14 is then grown on the P-Si substrate. This is accomplished by placing the structure in a furnace at about 800° C. in an oxygen ambient. The oxide layer 14 is grown to a thickness of approximately 151–50 ↑. /After this, silicon nitride layer 16 is deposited by low pressure CVD deposition to a thickness of approximately 100–200Å. Layer 16 is chosen for its masking and insulation properties. It must be a good oxidation mask and provide good electrical insulation. In addition, it should have a high dielectric constant which is higher than the dielectric constant of an oxide layer. Also, it must have high dielectric strength to prevent current leakages. Since silicon nitride has a high dielectric constant and a dielectric strength which is approximately equal to that of $SiO_2$, and is a good oxidation mask, it is a very suitable material. Another possible material for layer 16 is aluminum oxide, but this material is not as good an oxidation mask as silicon nitride.

In FIG. 1.3, a resist layer is spun onto the structure and is patterned to provide an undercut resist layer 18, of the type well known in the art. Patterned layer 18 will serve as a mask for the diffusion storage ion implantation. In this implantation, a doped region will be formed in the substrate 10 which will function as one electrode of the capacitor. Although ion implantation is used to form this region, the art termed it a "diffusion storage" region.

In FIG. 1.4, the diffusion storage region is the doped region 20, having opposite conductivity type than the substrate 10. For example, implantation of arsenic (As) ions can be used to create an N+ region 20, having a doping level of $10^{18}$–$10^{19}$ carriers/cm$^3$. Typical doping levels for the substrate 10 are $10^{15}$–$10^{16}$.

In the formation of diffusion storage area 20, low current ion implantation is used to preserve the undercut edge profile of the resist layer 18 for lift-off. Ions other than arsenic can be used to do this, such as antimony ions and others well known in the art.

A layer 22 of aluminum (Al) is then deposited through the patterned masking layer 18. Materials other than Al can be used, as long as the material is a mask for etching the underlying silicon nitride layer 16. The thickness of Al layer 22 is approximately 1000–2000Å. Its thickness is not critical and must be sufficient that it will serve as a silicon nitride etching mask. When the resist layer 18 is lifted-off, Al deposited over resist layer 18 is also removed, to yield the structure of FIG. 1.5.

The portions of oxide layer 14 and silicon nitride layer 16 which are unprotected by masking layer 22 are etched away to provide the structure of FIG. 1.6. Reactive ion etching (RIE) can be used to etch both the silicon nitride layer and the thin oxide layer. As an alternative, wet etching can be used to etch the oxide layer 14.

The masking layer 22 is then removed by wet etching using a conventional etchant. This leaves the structure of FIG. 1.7, in which a layer 14 of SiO$_2$ and a layer 16 of SiN$_x$ are present only in the region to be used for the storage capacitor. The N+ doped region 20 will serve as one electrode of the capacitor.

A gate oxide is then grown as indicated in FIG. 1.8. This gate oxide is the layer 24, which is comprised of silicon dioxide. It is produced by putting the structure of FIG. 1.7 in a furnace in oxygen ambient, and heating to approximately 800°–1000° C. The silicon nitride layer 16 impedes the growth of oxide layer 14 thereunder and for this reason gate oxide 24 will be thicker than the layer of oxide in the capacitor region of the circuit. Typically, the gate oxide is grown to a depth of approximately 150–300Å, although this thickness can be chosen in accordance with the design layer 14. Silicon nitride also has approximately the same dielectric strength as silicon dioxide, so that, for a given voltage across the capacitor, the same thickness of dielectric can be used while obtaining a higher capacitance. Also, the high dielectric strength of silicon nitride helps to prevent leakage currents through the capacitor.

The remainder of the process is the same as that conventionally used to make single poly one-device memory cells. In this process, a polysilicon layer is deposited and then patterned with a resist mask to leave a polysilicon region 26 wich is the gate electrode of the underlying FET, and a polysilicon region 28, which is the top electrode of the storage capacitor. Current flow electrodes 30 and 32 can then be ion implanted into substrate 10, using the overlying polysilicon region 26 as a mask. During this ion implantation, the polysilicon layer will become doped to make it conductive. It can then be used as the gate electrode (gate region 26) and as the top electrode (region 28) of the storage capacitor. The final structure is depicted in FIG. 1.9, which is a single poly, one-device integrated memory cell comprised of a storage capacitor and a single FET. Electrical contacts to current flow electrodes 30, 32 are made in the usual way.

In the process depicted in FIGS. 1.1–1.9, the masking layer 18 was used to define the location of the etch mask 22 in the storage capacitor region. In later processing steps, the underlying insulating layers were protected by etch mask 22 so that different effects would be achieved in the region of the gate electrode than in the region of the storage capacitor. No additional masking steps were required to provide these different insulator systems in this single poly, one-device memory cell.

As a variation to this process, patterned resist layer 18 can be used as a mask to form a Hi-C region under the diffused storage region 20. In this variation ions, such as boron, are ion implanted through mask 18. After this, the rest of the process would proceed as illustrated in FIGS. 1.5–1.9. The etch mask 22 would be deposited after the Hi-C ion implantation.

This process can be used to provide a capacitor dielectric which is comprised of different materials than the gate dielectric. It is also possible to provide a capacitor dielectric that is thinner than the gate dielectric, using this basic process. As another alternative, the silicon nitride layer 16 could be etched away after the gate oxide 24 is grown. This would leave a structure in which silicon oxide would be used for both the storage capacitor dielectric and the gate dielectric, but the storage capacitor dielectric would be thinner than the gate dielectric.

With minor modificatins apparent to those of skill in the art, this proces can be applied to other insulator systems, such as thermally grown silicon nitride or plasma enhanced thermally grown silicon nitride. It has been experimentally demonstrated that any pinholes in the nitride layer 16 will be sealed during the growth of the gate oxide, as depicted in FIG. 1.8. This is an advantage because the yield of the process will be enhanced.

The various lift-off steps indicated in FIGS. 1.1–1.7 are known in the art, as can be seen by referring to U.S. Pat. No. 4,144,101, assigned to the same assignee as the present application. That patent describes a lift-off technique for deposition of a metal mask to be used for etching. The teachings of that patent are incorporated herein by reference as being illustrative of some of the process steps of this invention.

FIGS. 2.1–2.6

In this embodiment, the Hi-C or diffusion store ion implantation mask level is also used to provide different insulator systems for the storage capacitor and the FET. However, this embodiment is not as technically advantageous as the embodiment of FIGS. 1.1–1.9. In the present embodiment, as composite dielectric is not provided in the storage capacitor region, and it si somewhat difficult to control the gate oxide thickness. However, this embodiment does provide a process in which an existing mask level can be used to provide different insulator systems.

Initially, the semiconductor substrate is processed in the same manner as was the semiconductor substrate in the first embodiment. Thus, FIG. 2.1 shows a P-type silicon substrate 40 having a recessed oxide isolation region 42. A thin oxide layer 44 is then thermally grown on substrate 40 as indicated in FIG. 2.2. This step is the same as the corresponding step in the first embodiment.

A resist layer is then spun onto the structure of FIG. 2.2, and is patterned to provide the patterned resist layer 46. In constrast with the resist layer 18 (FIG. 1.3), resist layer 46 need not have an undercut. This is because lift-off of an overlying mask layer will not be used in this embodiment.

Patterned resist layer 56 is the diffusion storage ion implantation mask, and ions such as As and Sb are implanted into substrate 40 to create the N$^{30}$ diffused storage region 48. Region 48 has the same function as region 20 of the first embodiment, i.e., it is a first electrode of the storage capacitor. In FIG. 2.4, the portion of the thin oxide layer 44 defined by the patterned resist 46 has been etched, using either RIE or a wet chemical etch, and resist layer 46 has been stripped away. In this structure, the remaining portions of thin oxide layer 44 are present in the area in which the FET will be fabricated, but not in portions of the substrate 40 where the storage capacitor will be fabricated.

The storage gate insulator is then formed by thermal growth of a silicon oxide layer over the entire substrate 40, the silicon dioxide layer 44, and silicon dioxide field implant region 42. This is illustrated by FIG. 2.5, in which thermally grown oxide layer 50 serves as the storage capacitor dielectric, while the thicker portion 52 of the grown oxide layer functions as the gate insulation. Portion 52 is thicker than portion 50, because the thin thermally grown oxide layer 44 was left in the region where the gate insulation was to be formed, but was removed from the region of the storage capacitor (FIG. 2.4).

In FIG. 2.5, a single composition material (silicon oxide) is used for the dielectric in both the storage capacitor and the FET. However, the thickness of this layer in the region of the FET is greater than that in the region of the storage capacitor. Generally, this is a desirable feature from a design standpoint. Since it is also desirable to have a higher capacitance per unit area in the storage capacitor region, this thinner storage dielectric is advantageous.

As an alternative, different insulator can be formed after the structure of FIG. 2.4 is obtained. For example, a layer of silicon nitride can be deposited by CVD over implanted area 48 and over the oxide insulation 44. This would leave a total insulator thickness which is greater in the FET region than in the capacitor region, and the FET gate insulation would be a $SiO_2/Si_3N_4$ composite, while the capacitor dielectric would be $Si_3N_4$.

After this, the same process steps are used to provide the final structure, indicated in FIG. 2.6, as were used in the first embodiment. That is, a polysilicon layer is deposited and then patterned with a resist mask to provide top storage capacitor electrode 54 and FET gate electrode 56. The polysilicon regions 54 and 56 are then used an ion implantation mask.

While the invention has been described with respect to specific embodiments thereof, it will be apparent to those of skill in the art that variations can be provided without departing from the spirit and scope of the present invention. In this regard, the invention is particularly directed to a process for making a single polysilicon, one-device FET-storage capacitor circuit wherein different insulator systems for the storage capacitor and the FET can be provided by using a mask already in the process, and in particular the mask used to provide either the diffusion store region or the Hi-C region, if such Hi-C region is used to provide a higher diffusion capacitance between the diffusion store regions and the substrate.

What is claimed is:

1. A method for making a single poly, integrated one-device FET-storage capacitor circuit wherein the capacitor dielectric insulator and the FET gate dielectric insulator can be individually established without an additional masking step, comprising the steps of:
   forming an insulating layer on a semiconductor substrate having a first conductively type,
   forming a patterned masking layer on said insulating layer,
   ion implanting said semiconductor substrate through said masking layer to produce an opposite conductivity type region in said substrate, said opposite conductivity type region being one electrode of said storage capacitor,
   etching said insulating layer through said masking layer to etch the portion of said insulating layer in the storge capacitor are to reduce its thickness,
   removing said masking layer,
   forming an additional insulating layer in said storage capacitor area and in said FET area, the final thickness of insulating layer in said FET area being different than that in said capacitor area,
   forming a patterned single layer of polycrystalline semiconductor on said insulating material, a first portion of said polycrystalline semiconductor being an electrode for said storage capacitor and the second portion of said polycrystalline semiconductor being a gate electrode for said FET,
   forming current flow electrodes of said FET in said semiconductor substrate, and
   forming electrode contacts to said current flow electrodes of said FET.

2. The method of claim 1, where said semiconductor substrate is silicon.

3. The method of claim 2, where said insulating layer is an oxide of silicon.

4. The method of claim 3, where said oxide is thermally grown on said silicon.

5. The method of claim 3, where said additional insulating layer is an oxide of silicon.

6. The method of claim 5, where said additional insulating layer is thermally grown.

7. The method of claim 1, where the etching of said insulating layer through said mask totally removes the insulating layer where it is etched.

8. The method of claim 1, where the final thickness of said insulating layer in said storage capacitor is less than its thickness in said FET.

9. The method of claim 8, where said additional insulating layer is comprised of a different material than the insulating layer formed on said semiconductor substrate.

10. The method of claim 1, where said additional insulating layer is a different material than said insulating layer formed on said semiconductor substrate.

11. The method of claim 10, where said additional insulating layer is silicon nitride, and said insulating layer formed on said semiconductor substrate is $SiO_2$.

12. A method for making an integrated circuit comprised of a single FET and a storage capacitor integrated in a structure using a single polycrystalline semiconductor layer wherein the capacitor insulator and the FET gate dielectric insulator are different, without requiring an additional masking step in the method, said method comprising the steps of:
   forming at least one layer of insulating material on a semiconductor substrate of a first conductivity type,
   forming a patterned mask on said at least one layer of said insulating material.
   said patterned mask having an opening in the area of said semiconductor substrate where said storage capacitor is to be formed and covering the area of said semiconductor substrate where said FET is to be formed,
   ion implanting said semiconductor substrate through said opening to produce an opposite conductivity region in said semiconductor substrate which is one electrode of said storage capacitor,
   depositing a masking layer through said opening in said mask to protect said at least one layer of insulating material in the capacitor area during a subsequent etching step,
   removing said patterned mask to expose said at least one layer of insulating material in the FET portion of said circuit,
   etching said at least one layer of insulating layer in said FET area, said at least one layer of insulating material being protected by said masking in said capacitor area,
   forming an additional insulating layer in said FET area,
   forming a patterned single layer of polycrystalline semiconductor on said insulating material, a first portion thereof being an electrode for said storage capacitor and a second portion thereof being a gate electrode for said FET,
   forming current flow electrodes in said semiconductor substrate, and providing electrical contact to said current flow electrodes.

13. The method of claim 12, where said at least one layer of insulating material includes first and second layers of different insulating material.

14. The method of claim 12, where said semiconductor substrate is silicon.

15. The method of claim 14, where said at least one layer of insulating material includes a layer of an oxide of silicon and a layer of silicon nitride.

16. The method of claim 15, where said oxide and silicon nitride layers are etched in said FET area.

17. The method of claim 16, where said additional insulating material is an oxide layer.

18. The method of claim 17, where said additional insulating oxide is a thermally grown oxide of silicon.

19. The method of claim 18, where said FET area includes a gate insulator comprised of an oxide of silicon and said capacitor area includes an insulator having a first layer of an oxide of silicon and a second layer of silicon nitride.

20. The method of claim 18, where the thickness of insulator in the capacitor area is different than the thickness of insulator of the FET area.

21. The method of claim 12, where said masking layer is a metal layer.

22. The method of claim 12, where said patterned mask includes an undercut in said opening, said semiconductor substrate is silicon, said at least one layer of insulating material includes a first layer of thermally grown silicon oxide and an overlying of silicon nitride, and wherein the dielectric insulator of said storage capacitor is comprised of an oxide of silicon and silicon nitride and wherein the gate dielectric insulator in said FET is comprised of an oxide of silicon, and further wherein said polycrystalline semiconductor layer is a layer of polycrystalline silicon, said current flow electrodes of said FET being produced by ion implantation using said polycrystalline layer as a mask.

* * * * *